(12) United States Patent
Liao (10) Patent No.: US 11,600,708 B2
(45) Date of Patent: Mar. 7, 2023

(54) SEMICONDUCTOR DEVICE AND MANUFACTURING METHOD THEREOF

(71) Applicant: INNOSCIENCE (ZHUHAI) TECHNOLOGY CO., LTD., Zhuhai (CN)

(72) Inventor: Hang Liao, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 160 days.

(21) Appl. No.: 16/869,563

(22) Filed: May 7, 2020

(65) Prior Publication Data

US 2021/0328029 A1 Oct. 21, 2021

(30) Foreign Application Priority Data

Apr. 17, 2020 (CN) .......................... 202010305967.6

(51) Int. Cl.

| | | |
|---|---|---|
| H01L 29/778 | (2006.01) | |
| H01L 29/66 | (2006.01) | |
| H01L 29/40 | (2006.01) | |
| H01L 21/02 | (2006.01) | |
| H01L 21/765 | (2006.01) | |
| H01L 23/29 | (2006.01) | |
| H01L 23/31 | (2006.01) | |
| H01L 29/20 | (2006.01) | |
| H01L 29/205 | (2006.01) | |

(52) U.S. Cl.
CPC ........ *H01L 29/408* (2013.01); *H01L 21/0217* (2013.01); *H01L 21/02164* (2013.01); *H01L 21/765* (2013.01); *H01L 23/291* (2013.01); *H01L 23/3171* (2013.01); *H01L 23/3192* (2013.01); *H01L 29/2003* (2013.01); *H01L 29/205* (2013.01); *H01L 29/404* (2013.01); *H01L 29/66462* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| | | | | |
|---|---|---|---|---|
| 9,722,063 | B1 * | 8/2017 | Kudymov | ........... H01L 29/7787 |
| 2012/0018735 | A1 * | 1/2012 | Ishii | ................. H01L 29/66431 |
| | | | | 257/E29.242 |
| 2017/0133496 | A1 * | 5/2017 | Tsai | ................ H01L 21/823456 |
| 2018/0190777 | A1 * | 7/2018 | Tomomatsu | ........ H01L 29/4238 |
| 2020/0350399 | A1 * | 11/2020 | Wong | .................. H01L 29/7787 |
| 2021/0257476 | A1 * | 8/2021 | Lin | ..................... H01L 29/7787 |

* cited by examiner

*Primary Examiner* — Grant S Withers
(74) *Attorney, Agent, or Firm* — Idea Intellectual Limited; Margaret A. Burke; Sam T. Yip (57) ABSTRACT

The present disclosure relates to a semiconductor device and a manufacturing method thereof. The semiconductor device includes: a substrate, a doped group III-V layer, a gate conductor, a field plate, a first passivation layer, and a second passivation layer. The doped group III-V layer is disposed on the substrate. The gate conductor is disposed on the doped group III-V layer. The field plate is disposed on the gate conductor. The first passivation layer is located between the field plate and the gate conductor. The second passivation layer is located between the field plate and the first passivation layer.

8 Claims, 8 Drawing Sheets

SEMICONDUCTOR DEVICE AND MANUFACTURING METHOD THEREOF

CROSS REFERENCE TO RELATED APPLICATIONS

The present application claims the benefit of priority from the China Patent Application No. 202010305967.6 filed on 17 Apr. 2020, the disclosure of which is hereby incorporated by reference in its entirety.

TECHNICAL FIELD

The present disclosure relates to a semiconductor device and a manufacturing method thereof, and in particular, to a semiconductor device having a doped group III-V layer and a passivation layer.

BACKGROUND

A component that includes a direct bandgap semiconductor, for example, a semiconductor component that includes a group III-V material or a group III-V compound can operate or work in various conditions or environments (for example, under different voltages or frequencies) due to their properties.

Such semiconductor components may include a heterojunction bipolar transistor (HBT), a heterojunction field effect transistor (HFET), a high-electron-mobility transistor (HEMT), a heterojunction diode, or a modulation-doped FET (MODFET), or the like.

As a typical representative of the third-generation semiconductor materials, wide-forbidden-band semiconductor gallium nitride (GaN) has many excellent properties that silicon materials do not have, and is an excellent semiconductor material for high-frequency, high-voltage, high-temperature, and high-power applications, and has a broad prospect for civil and commercial applications.

SUMMARY

Some embodiments of the present disclosure disclose a semiconductor device, and the semiconductor device includes a substrate, a doped group III-V layer, a gate conductor, a field plate, a first passivation layer, and a second passivation layer. The doped group III-V layer is disposed on the substrate. The gate conductor is disposed on the doped group III-V layer. The field plate is disposed on the gate conductor. The first passivation layer is located between the field plate and the gate conductor. The second passivation layer is located between the field plate and the first passivation layer.

Some embodiments of the present disclosure disclose a semiconductor device, and the semiconductor device includes a substrate, a doped group III-V layer, a gate conductor, a first passivation layer, and a second passivation layer. The doped group III-V layer is disposed on the substrate. The gate conductor is disposed on the doped group III-V layer. The first passivation layer is disposed on the doped group III-V layer. The second passivation layer is disposed on the first passivation layer.

BRIEF DESCRIPTION OF THE DRAWINGS

The aspects of the present disclosure will become more comprehensible from the following detailed description made with reference to the accompanying drawings. It should be noted that, various features may not be drawn to scale. In fact, the sizes of the various features may be increased or reduced arbitrarily for the purpose of clear description.

DETAILED DESCRIPTION

The following disclosure provides many different embodiments or examples for implementing different features of the provided subject matter. Specific examples of components and arrangements are described below. Certainly, these descriptions are merely examples and are not intended to be limiting. In the present disclosure, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in the present disclosure, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

Direct bandgap materials, such as group III-V compounds, may include but are not limited to, gallium arsenide (GaAs), indium phosphide (InP), gallium nitride (GaN), indium gallium arsenide (InGaAs), aluminum gallium arsenide (InAlAs), and the like.

An epitaxial layer formed on a substrate may cause dislocation or other crystal defects due to crystal lattice mismatch, mismatch of coefficient of thermal expansion (CTE) or other factors. Crystal defects may cause a surface state on a surface of the epitaxy layer, and further cause problems such as surface leakage and current collapse.

To reduce the surface state caused by crystal defects, a passivation layer may be formed on the epitaxy layer (a group III-V layer). Passivation layer materials may generally be classified into a low-k dielectric material and a high-k dielectric material. Low-k dielectric materials may include a material having a lower dielectric constant than silicon dioxide ($SiO_2$). High-k dielectric materials may include a material having a higher dielectric constant than silicon dioxide ($SiO_2$).

Simply forming a single low-k dielectric layer (or passivation layer) on the epitaxy layer will decrease capabilities of a field plate in masking two-dimensional electron gas (2DEG), where the field plate is disposed above the passivation layer. For example, the use of a single low-k dielectric layer will decrease the capabilities of the field plate in masking 2DEG in a channel layer of an HEMT, and lead to a relatively large parasitic capacitance (Cgd) between a gate and a drain. Consequently, a Miller charge ratio (Qgd/Qgs) of the semiconductor device is greater than 1, and a problem of false turn-on may occur. Here Qgd means the amount of charge between the gate and the drain of the semiconductor device, and Qgs means the amount of charge between the gate and the source of the semiconductor device.

On the other hand, in a case that a single high-k dielectric material layer (or passivation layer) is simply formed on the epitaxy layer, because the high-k dielectric material has relatively many crystal defects, a trapping property of an interface between the high-k dielectric material layer and the epitaxy layer is relatively poor, and current collapse is likely to occur.

The present disclosure discloses a semiconductor device having a two-layer or multi-layer passivation layer structure. In some embodiments, the first passivation layer formed on an epitaxy material may be of a low-k dielectric material, and the second passivation layer formed on the first passivation layer may be of a high-k dielectric material.

The first passivation layer that is of a low-k dielectric material and formed on the epitaxy material reduces defects of the interface between the first passivation layer and the epitaxy layer, and optimizes the trapping property of the interface to prevent current collapse. The second passivation layer that is of a high-k dielectric material and formed on the first passivation layer enhances capabilities of the field plate in masking the 2DEG, and causes the Miller charge ratio (Qgd/Qgs) to be less than 1 to prevent the semiconductor device from being falsely turned on. A thickness and a k value of the low-k dielectric material layer, a thickness and a k value of the high-k dielectric material layer, and a length of the field plate itself all affect the capabilities of the field plate in masking 2DEG.

Figure 1:
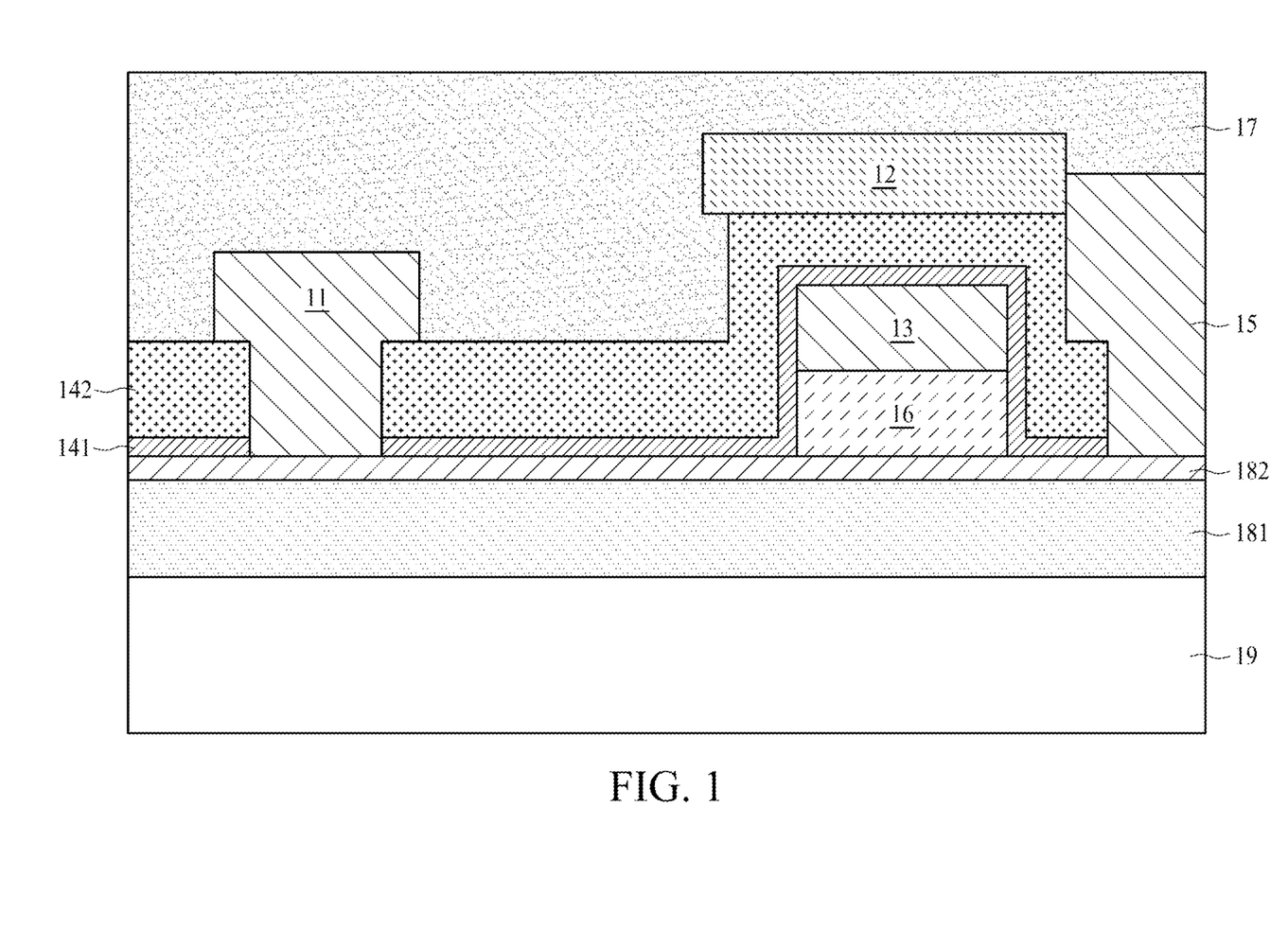
FIG. 1 is a side view of a semiconductor device according to some embodiments of the present disclosure.

FIG. 1 is a side view of a semiconductor device 1 according to some embodiments of the present disclosure.

As shown in FIG. 1, the semiconductor device 1 may include a substrate 19, a group III-V layer 181, a group III-V layer 182, a dielectric layer 17, a doped group III-V layer 16, a source conductor 15, a passivation layer 141, a passivation layer 142, a gate conductor 13, a field plate 12, and a drain conductor 11.

The substrate 19 may include, but without limitation, silicon (Si), doped silicon (doped Si), silicon carbide (SiC), silicon germanium (SiGe), gallium arsenide (GaAs), or other semiconductor materials. The substrate 19 may include, but without limitation, sapphire, silicon on insulator (SOI), or other appropriate materials. In some embodiments, the substrate 19 may further include a doped region (not shown in FIG. 1), such as a p-well, or an n-well.

The group III-V layer 181 may be disposed on the substrate 19. In the semiconductor device 1, the group III-V layer 181 may serve as a channel layer. The group III-V layer 181 may have an electronic channel region. The electronic channel region may include a 2DEG region. The 2DEG region is generally easily available from a heterostructure. In the 2DEG region, an electron gas may move freely in a two-dimensional direction, but is restricted in a three-dimensional direction.

The group III-V layer 181 may include, but without limitation, a group III nitride such as a compound $In_xAl_yGa_{1-x-y}N$, where $x+y \le 1$. The group III nitride may further include, but without limitation, a compound $Al_yGa_{(1-y)}N$, where $y \le 1$.

The group III-V layer 182 may be disposed on the group III-V layer 181. In the semiconductor device 1, the group III-V layer 182 may serve as a barrier layer. The group III-V layer 182 may include, but without limitation, a group III nitride such as a compound $In_xAl_yGa_{1-x-y}N$, where $x+y \le 1$. The group III nitride may further include, but without limitation, a compound $Al_yGa_{(1-y)}N$, where $y \le 1$. The group III-V layer 182 may have a larger bandgap than the group III-V layer 181. For example, the group III-V layer 181 may include a GaN layer. The GaN may have a bandgap of approximately 3.4V. The group III-V layer 182 may include AlGaN. The AlGaN may have a bandgap of approximately 4V. The 2DEG region is generally formed on a layer with a small bandgap (for example, GaN). A heterojunction is formed between the group III-V layer 182 and the group III-V layer 181. Polarization of a heterojunction between different nitrides leads to formation of a 2DEG region on the group III-V layer 181. The group III-V layer 181 may provide or remove electrons in the 2DEG region to control turn-on or turn-off of the semiconductor device 1.

The doped group III-V layer 16 may be disposed on the substrate 19. The doped group III-V layer 16 may be disposed on the group III-V layer 181. The doped group III-V layer 16 may be disposed on the group III-V layer 182.

The doped group III-V layer 16 may include, but without limitation, doped gallium nitride (doped GaN), doped aluminum gallium nitride (doped AlGaN), doped indium gallium nitride (doped InGaN), and other doped group III-V compounds. The doped group III-V layer 16 may include, but without limitation, a p-type dopant or other dopants. In some embodiments, exemplary dopants may include, but without limitation, magnesium (Mg), zinc (Zn), cadmium (Cd), silicon (Si), germanium (Ge), and the like.

The gate conductor 13 may be disposed on the doped group III-V layer 16. In the semiconductor device 1, the gate conductor 13 may be configured to control the 2DEG in the group III-V layer 181. In some embodiments, the gate conductor 13 may include, but without limitation, a refractory metal or a compound thereof. For example, the gate conductor 13 may include, but without limitation, niobium (Nb), molybdenum (Mo), tantalum (Ta), tungsten (W), rhenium (Re), titanium (Ti), vanadium (V), Chromium (Cr), zirconium (Zr), hafnium (Hf), ruthenium (Ru), osmium (Os), iridium (Ir) and other metals or compounds of the metals, such as tantalum nitride (TaN), titanium nitride (TiN), and tungsten carbide (WC).

The gate conductor 13 may directly contact the doped group III-V layer 16. The gate conductor 13 may be electrically connected to the doped group III-V layer 16.

The passivation layer 141 may be disposed on the gate conductor 13. The passivation layer 141 may surround the gate conductor 13. The passivation layer 141 may cover the gate conductor 13. The passivation layer 141 may surround the doped group III-V layer 16. The passivation layer 141 may cover the doped group III-V layer 16. The passivation layer 141 may be disposed on the group III-V layer 182. The passivation layer 141 may be located between the field plate 12 and the gate conductor 13. The passivation layer 141 may be located between the passivation layer 142 and the gate conductor 13. In some embodiments, the passivation layer 141 may include, but without limitation, oxides or nitrides, such as silicon nitride ($Si_3N_4$), silicon oxide ($SiO_2$), and the like. The passivation layer 141 may include, but without limitation, a composite layer of oxide and nitride, such as $Al_2O_3/SiN$, $Al_2O_3/SiO_2$, $Al_2O_3/Si_3N_4$, $AlN/SiN$, $AlN/SiO_2$, and $AlN/Si_3N_4$.

The passivation layer 142 may be disposed on the passivation layer 141. The passivation layer 142 may surround the gate conductor 13. The passivation layer 142 may cover the gate conductor 13. The passivation layer 142 may surround the doped group III-V layer 16. The passivation layer 142 may cover the doped group III-V layer 16. The passivation layer 142 may surround the passivation layer 141. The passivation layer 142 may cover the passivation layer 141. The passivation layer 142 may be disposed on the group III-V layer 182. The passivation layer 142 may be located between the field plate 12 and the gate conductor 13. The passivation layer 142 may be located between the field plate 12 and the passivation layer 141. In some embodiments, the passivation layer 142 may include, but without limitation, oxides or nitrides, such as silicon nitride ($Si_3N_4$), silicon oxide ($SiO_2$), and the like. The passivation layer 142 may include, but without limitation, a composite layer of oxide and nitride, such as $Al_2O_3$/SiN, $Al_2O_3$/$SiO_2$, $Al_2O_3$/$Si_3N_4$, AlN/SiN, AlN/$SiO_2$, and AlN/$Si_3N_4$.

The dielectric constant of the passivation layer 141 may be different from the dielectric constant of the passivation layer 142. The dielectric constant of the passivation layer 141 may be less than the dielectric constant of the passivation layer 142. The passivation layer 141 may be of a material that has a relatively low dielectric constant, and the passivation layer 142 may be of a material having a relatively high dielectric constant. In some embodiments, the passivation layer 141 may include $SiO_2$ and the passivation layer 142 may include $Si_3N_4$. Both the passivation layer 141 and the passivation layer 142 may be located between the gate conductor 13 and the field plate 12. Both the passivation layer 141 and the passivation layer 142 may be located under the field plate 12.

The passivation layer 141 that abuts the group III-V layer 182 may be of a low-k dielectric material, so as to reduce defects of the passivation layer 141 and the group III-V layer 182 and thus prevent current collapse. The passivation layer 142 that abuts the field plate 12 may use a high-k dielectric material to enhance the capabilities of the field plate 12 in masking 2DEG. The passivation layer 141 that abuts the gate conductor 13 may be of a low-k dielectric material, so as to reduce defects of the passivation layer 141 and the gate conductor 13 and thus prevent current collapse. The passivation layer 142 that abuts the field plate 12 may use a high-k dielectric material to enhance the capabilities of the field plate 12 in masking 2DEG.

The semiconductor device 1 may also include other conductor structures. For example, the semiconductor device 1 may further include a drain conductor 11, a source conductor 15 or another conductor structure disposed on the substrate 19. Although the drain conductor 11 and the source conductor 15 are respectively disposed on two sides of the gate conductor 13 in FIG. 1, the drain conductor 11, the source conductor 15, and the gate conductor 13 may be configured differently in other embodiments of the present disclosure depending on design requirements.

The drain conductor 11 may be disposed on the group III-V layer 182. The drain conductor 11 may be surrounded by the passivation layer 141. The drain conductor 11 may be surrounded by the passivation layer 142. The drain conductor 11 may be covered by the dielectric layer 17. The drain conductor 11 may include, but without limitation, a conductor material. The conductor material may include, but without limitation, a metal, an alloy, a doped semiconductor material (such as a doped crystalline silicon) or another appropriate conductor material.

The source conductor 15 may be disposed on the group III-V layer 182. The source conductor 15 may be surrounded by the passivation layer 141. The source conductor 15 may be surrounded by the passivation layer 142. The source conductor 15 may be covered by the dielectric layer 17. The source conductor 15 may include, but without limitation, a conductor material. The conductor material may include, but without limitation, a metal, an alloy, a doped semiconductor material (such as a doped crystalline silicon) or another appropriate conductor material.

The field plate 12 may be disposed on the passivation layer 141. The field plate 12 may be disposed on the passivation layer 142. The field plate 12 may be at a zero potential. The field plate 12 may directly contact the source conductor 15. The field plate 12 may be connected to the source conductor 15 through another conductor structure. In some embodiments, the field plate 12 may be electrically connected to the source conductor 15. The field plate 12 may include a conductor material. The field plate 12 may include a metal, an alloy, or other appropriate conductor material. In some embodiments, the material of the field plate 12 may be different from the materials of the drain conductor 11 and the source conductor 15.

The dielectric layer 17 may be disposed on the passivation layer 142. The dielectric layer 17 may cover the passivation layer 142. The dielectric layer 17 may be disposed on the drain conductor 11. The dielectric layer 17 may surround the drain conductor 11. The dielectric layer 17 may be disposed on the source conductor 15. The dielectric layer 17 may surround the source conductor 15. The dielectric layer 17 may be disposed on the field plate 12. The dielectric layer 17 may surround the field plate 12. The dielectric layer 17 may serve as an interlayer dielectric layer. The dielectric layer 17 may include a dielectric material. The dielectric layer 17 may include a nitride. The dielectric layer 17 may include, but without limitation, silicon nitride ($Si_3N_4$). The dielectric layer 17 may include an oxide. The dielectric layer 17 may include, but without limitation, silicon oxide ($SiO_2$). The dielectric layer 37 may be configured to prevent foreign substances such as moisture from entering the device. The dielectric layer 37 may be configured to withstand a mechanical stress of package singulation, thereby protecting the device.

In some embodiments, because the group III-V layer 181 has generated an actual channel (electronic channel region) under the gate conductor 13, the device is turned on by default in a case that the gate conductor 13 is in a zero-bias state. Such a device is also known as a depletion mode device.

The opposite of the depletion mode device is an enhancement mode device. The enhancement mode device is turned off by default in a case that the gate conductor 13 is in a zero-bias state.

Figure 2:
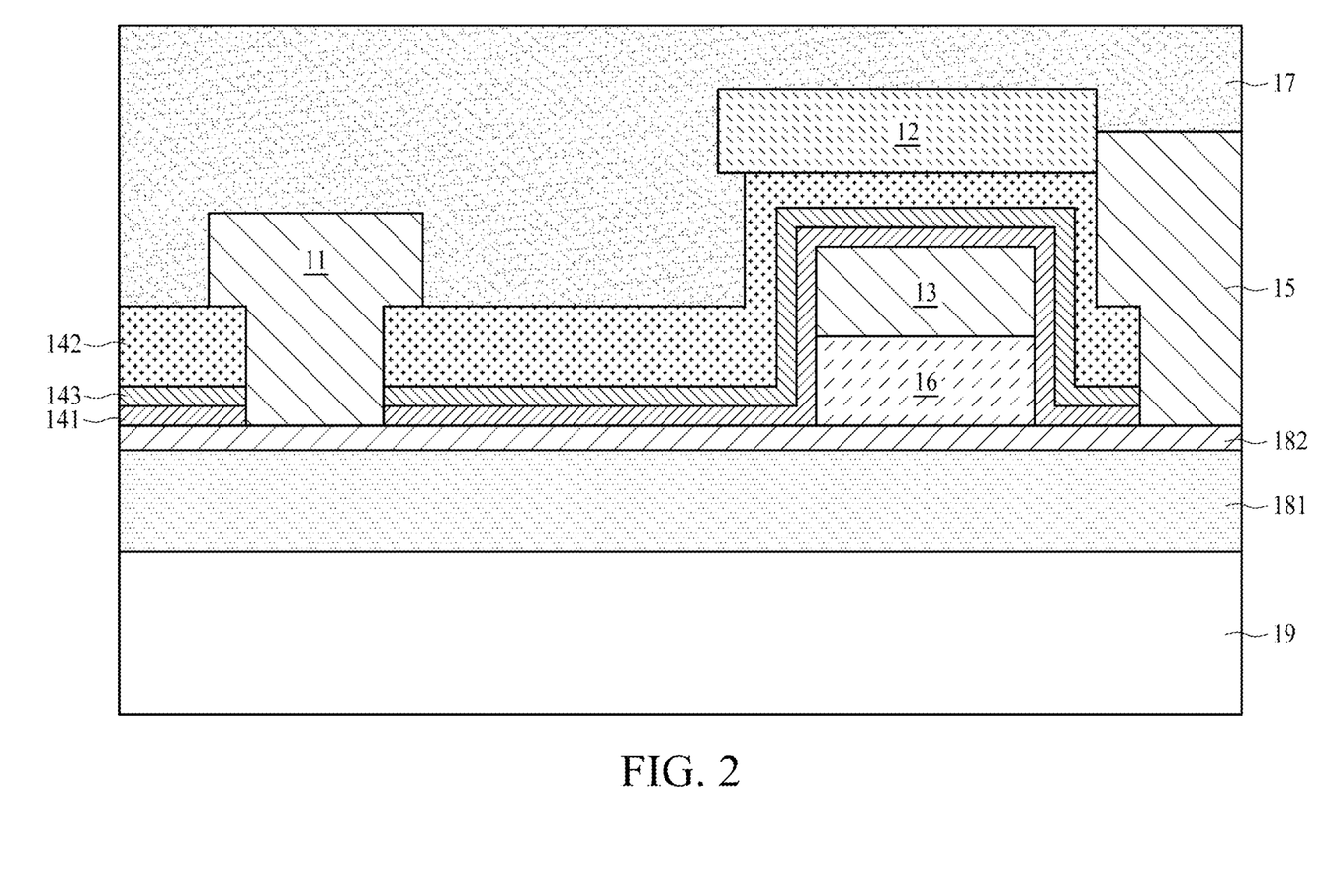
FIG. 2 is a side view of a semiconductor device according to some embodiments of the present disclosure.

FIG. 2 is a side view of a semiconductor device 2 according to some embodiments of the present disclosure.

As shown in FIG. 2, the semiconductor device 2 may include a substrate 19, a group III-V layer 181, a group III-V layer 182, a dielectric layer 17, a doped group III-V layer 16, a source conductor 15, a passivation layer 141, a passivation layer 142, a passivation layer 143, a gate conductor 13, a field plate 12, and a drain conductor 11.

Characteristics of the semiconductor device 2 are substantially the same as those of the semiconductor device 1 in FIG. 1. The semiconductor device 2 differs from the semiconductor device 1 in FIG. 1 in that the semiconductor device 2 further includes a passivation layer 143.

The passivation layer 143 may be disposed on the passivation layer 141. The passivation layer 143 may surround the gate conductor 13. The passivation layer 143 may cover the gate conductor 13. The passivation layer 143 may surround the doped group III-V layer 16. The passivation layer 143 may cover the doped group III-V layer 16. The passivation layer 143 may surround the passivation layer 141. The passivation layer 143 may cover the passivation layer 141. The passivation layer 143 may be disposed on the group III-V layer 182. The passivation layer 143 may be located between the field plate 12 and the gate conductor 13. The passivation layer 143 may be located between the field plate 12 and the passivation layer 141. The passivation layer 143 may be disposed under the passivation layer 142. The passivation layer 143 may be surrounded by the passivation layer 142. The passivation layer 143 may be covered by the passivation layer 142. The passivation layer 143 may be disposed between the passivation layer 141 and the passivation layer 142. The passivation layer 143 may be disposed on the gate conductor 13 and between the passivation layer 141 and the passivation layer 142. The passivation layer 143 may be disposed under the field plate 12 and between the passivation layer 141 and the passivation layer 142. In some embodiments, the passivation layer 143 may include, but without limitation, oxides or nitrides, such as silicon nitride ($Si_3N_4$), silicon oxide ($SiO_2$), and the like. The passivation layer 143 may include, but without limitation, a composite layer of oxide and nitride, such as $Al_2O_3$/SiN, $Al_2O_3$/$SiO_2$, $Al_2O_3$/$Si_3N_4$, AlN/SiN, AlN/$SiO_2$, and AlN/$Si_3N_4$.

The dielectric constant of the passivation layer 143 may be different from the dielectric constant of the passivation layer 141. The dielectric constant of the passivation layer 143 may be different from the dielectric constant of the passivation layer 142. The dielectric constant of the passivation layer 143 may be greater than the dielectric constant of the passivation layer 141. The dielectric constant of the passivation layer 143 may be greater than the dielectric constant of the passivation layer 142. The dielectric constant of the passivation layer 143 may be less than the dielectric constant of the passivation layer 142. The dielectric constant of the passivation layer 143 may be less than the dielectric constant of the passivation layer 142 and greater than the dielectric constant of the passivation layer 141. In a case that the passivation layer 141 is of a material that has a relatively low dielectric constant and the passivation layer 142 is of a material having a relatively high dielectric constant, the dielectric constant of the passivation layer 143 may be greater than the dielectric constant of the passivation layer 142. In some embodiments, the passivation layer 141 may include $SiO_2$, the passivation layer 142 may include $Al_2O_3$, and the passivation layer 143 may include $Si_3N_4$. All the passivation layer 141, the passivation layer 142, and the passivation layer 143 may be located between the gate conductor 13 and the field plate 12.

Although FIG. 2 illustrates that the semiconductor device 2 may have 3 passivation layers, the present disclosure is not limited to the illustration. In some embodiments, the semiconductor device 2 may include more than 3 passivation layers. In some embodiments, the semiconductor device 2 may include more than 3 passivation layers between the gate conductor 13 and the field plate 12. For example, there may be 4 passivation layers between the gate conductor 13 and the field plate 12. The 4 passivation layers may have different dielectric constants. The dielectric constant of the passivation layer that abuts the gate conductor 13 may be less than the dielectric constant of the passivation layer that abuts the field plate 12. For example, there may be n passivation layers between the gate conductor 13 and the field plate 12. The n passivation layers may have different dielectric constants. The dielectric constant of the passivation layer that abuts the gate conductor 13 may be less than the dielectric constant of the passivation layer that abuts the field plate 12. For example, there may be n passivation layers between the gate conductor 13 and the field plate 12. The n passivation layers may have different dielectric constants. In a direction from the gate conductor 13 to the field plate 12, the dielectric constants of the n passivation layers may increase layer by layer. For example, there may be n passivation layers between the gate conductor 13 and the field plate 12. The n passivation layers may have different dielectric constants. The passivation layer that abuts neither the gate conductor 13 nor the field plate 12 may have a smallest dielectric constant. For example, there may be n passivation layers between the gate conductor 13 and the field plate 12. The n passivation layers may have different dielectric constants. The passivation layer that abuts neither the gate conductor 13 nor the field plate 12 may have a largest dielectric constant.

Figure 3:
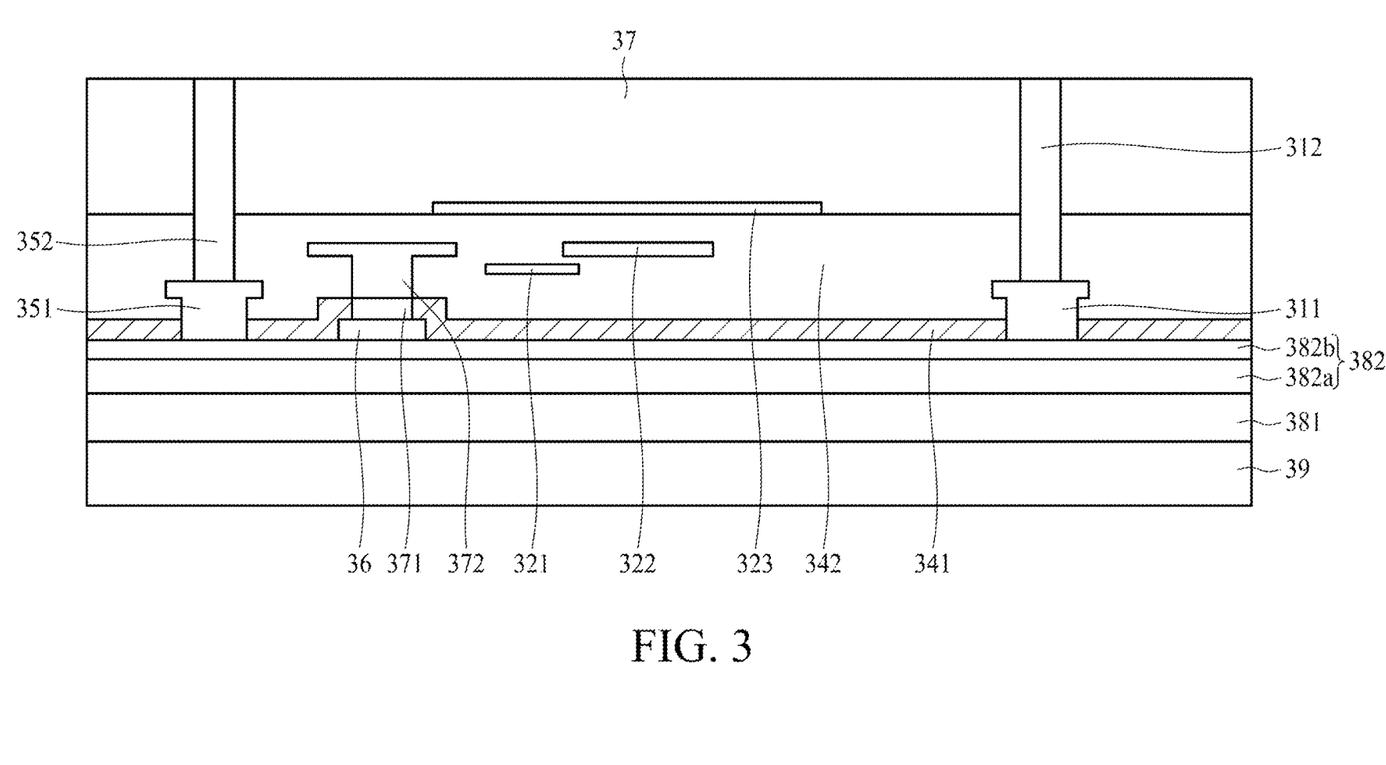
FIG. 3 is a side view of a semiconductor device according to some embodiments of the present disclosure.

FIG. 3 is a side view of a semiconductor device 3 according to some embodiments of the present disclosure.

As shown in FIG. 3, the semiconductor device 3 may include a substrate 39, a superlattice layer 381, a group III-V layer 382, a metal layer 371, a gate conductor 372, a doped group III-V layer 36, a source conductor 351, an interconnect structure 352, a passivation layer 341, a passivation layer 342, a field plate 321, a field plate 322, a field plate 323, a drain conductor 311, and an interconnect structure 312.

The substrate 39 may include, but without limitation, silicon (Si), doped silicon (doped Si), silicon carbide (SiC), silicon germanium (SiGe), gallium arsenide (GaAs), or other semiconductor materials. The substrate 39 may include, but without limitation, sapphire, silicon on insulator (SOI), or other appropriate materials. In some embodiments, the substrate 39 may further include a doped region (not shown in FIG. 3), such as a p-well, or an n-well. The substrate 39 may have an active layer and a back layer opposite to the active layer. An integrated circuit may be formed above the active layer.

The superlattice layer 381 may be disposed on the substrate 39. The superlattice layer 381 may be located between the substrate 39 and the group III-V layer 382.

The superlattice layer 381 may include a single-layer structure. The superlattice layer 381 may include a multi-layer structure or a multi-layer stack, such as a multi-layer stack of AlN/GaN pairs. In some embodiments, the superlattice layer 381 can reduce a stress of the semiconductor device 3. In some embodiments, the superlattice layer 381 can reduce a tensile stress of the semiconductor device 3. In some embodiments, the superlattice layer 381 may trap electrons diffused from the substrate 39 to the group III-V layer 382, thereby improving performance and reliability of the device. In some embodiments, the superlattice layer 381 may increase a breakdown voltage. In some embodiments, the semiconductor device 3 may further include a buffer layer (not shown in FIG. 3) disposed between the substrate 39 and the superlattice layer 381. In some embodiments, the buffer layer may be configured to improve lattice match between the substrate 39 and the superlattice layer 381. In some embodiments, the buffer layer may include, but without limitation, a nitride such as aluminum nitride (AlN) and aluminum gallium nitride (AlGaN).

The group III-V layer 382 may be disposed on the substrate 39. The group III-V layer 382 may be disposed on the superlattice layer 381. The group III-V layer 382 may include a multi-layer structure. The group III-V layer 382 may include a heterostructure. The group III-V layer 382 may further include a group III-V layer 382a and a group III-V layer 382b.

The group III-V layer 382a may be disposed on the superlattice layer 381. In the semiconductor device 3, the group III-V layer 382a may serve as a channel layer. The group III-V layer 382a may have an electronic channel region. The electronic channel region may include a 2DEG region. The 2DEG region is generally easily available from a heterostructure. In the 2DEG region, an electron gas may move freely in a two-dimensional direction, but is restricted in a three-dimensional direction.

The group III-V layer 382a may include, but without limitation, a group III nitride such as a compound $In_xAl_yGa_{1-x-y}N$, where x+y≤1. The group III nitride may further include, but without limitation, a compound $Al_yGa_{(1-y)}N$, where y≤1.

The group III-V layer 382b may be disposed on the group III-V layer 382a. In the semiconductor device 3, the group III-V layer 382b may serve as a barrier layer. The group III-V layer 382b may include, but without limitation, a group III nitride such as a compound $In_xAl_yGa_{1-x-y}N$, where x+y≤1. The group III nitride may further include, but without limitation, a compound $Al_yGa_{(1-y)}N$, where y≤1. The group III-V layer 382b may have a larger bandgap than the group III-V layer 382a. For example, the group III-V layer 382a may include a GaN layer. The GaN may have a bandgap of approximately 3.4V. The group III-V layer 382b may include AlGaN. The AlGaN may have a bandgap of approximately 4V. The 2DEG region is generally formed on a layer with a small bandgap (for example, GaN). A heterojunction is formed between the group III-V layer 382a and the group III-V layer 382b. Polarization of a heterojunction between different nitrides leads to formation of a 2DEG region on the group III-V layer 382a. The group III-V layer 382a may provide or remove electrons in the 2DEG region to control turn-on or turn-off of the semiconductor device 3.

The doped group III-V layer 36 may be disposed on the substrate 39. The doped group III-V layer 36 may be disposed on the group III-V layer 382. The doped group III-V layer 36 may be disposed on the group III-V layer 382b. The doped group III-V layer 36 may be located under the metal layer 371. The doped group III-V layer 36 may include, but without limitation, doped gallium nitride (doped GaN), doped aluminum gallium nitride (doped AlGaN), doped indium gallium nitride (doped InGaN), and other doped group III-V compounds. The doped group III-V layer 36 may include, but without limitation, a p-type dopant, an n-type dopant, or other dopants. In some embodiments, exemplary dopants may include, but without limitation, magnesium (Mg), zinc (Zn), cadmium (Cd), silicon (Si), germanium (Ge), and the like.

The metal layer 371 may be located on the doped group III-V layer 36. The metal layer 371 may directly contact the doped group III-V layer 36. The metal layer 371 may be electrically connected to the doped group III-V layer 36. The metal layer 371 may be located under the gate conductor 372. The metal layer 371 is located between the doped group III-V layer 36 and the gate conductor 372. In some embodiments, the metal layer 371 may include, but without limitation, a refractory metal or a compound thereof. For example, the metal layer 371 may include, but without limitation, niobium (Nb), molybdenum (Mo), tantalum (Ta), tungsten (W), rhenium (Re), titanium (Ti), vanadium (V), Chromium (Cr), zirconium (Zr), hafnium (Hf), ruthenium (Ru), osmium (Os), iridium (Ir) and other metals or compounds of the metals, such as tantalum nitride (TaN), titanium nitride (TiN), and tungsten carbide (WC).

The metal layer 371 may serve as a stop layer or protection layer of the doped group III-V layer 36 in a manufacturing process of the semiconductor device 3. For example, the metal layer 371 may substantially maintain relative flatness of an unexposed surface of the doped group III-V layer 36 during the use of a detachment technology (such as an etching technology). The metal layer 371 helps to improve bias control on the gate conductor 372. The metal layer 371 can reduce a gate leakage current.

The gate conductor 372 may be disposed on the doped group III-V layer 36. The gate conductor 372 may be electrically connected to the doped group III-V layer 36. The gate conductor 372 may be disposed on the metal layer 371. The gate conductor 372 may directly contact the metal layer 371. The gate conductor 372 may be electrically connected to the metal layer 371. The gate conductor 372 may include a gate structure. The gate conductor 372 may include a gate metal. In some embodiments, the gate metal may include, but without limitation, titanium (Ti), tantalum (Ta), tungsten (W), aluminum (Al), cobalt (Co), copper (Cu), nickel (Ni), platinum (Pt), lead (Pb), molybdenum (Mo), or a compound thereof (such as but without limitation, titanium nitride (TiN), tantalum nitride (TaN), other conductive nitrides or conductive oxides, or metal alloys (such as aluminum-copper alloy (Al—Cu)), or other appropriate materials. In some embodiments, the gate metal may include, but without limitation, a multilayer metal of titanium (Ti), aluminum-copper alloy (Al—Cu), and titanium nitride (TiN).

The passivation layer 341 may be disposed on the doped group III-V layer 36. The passivation layer 341 may be disposed on the group III-V layer 382. The passivation layer 341 may be disposed on the group III-V layer 382b. In some embodiments, the passivation layer 341 may include, but without limitation, oxides or nitrides, such as silicon nitride ($Si_3N_4$), silicon oxide ($SiO_2$), and the like. The passivation layer 341 may include, but without limitation, a composite layer of oxide and nitride, such as $Al_2O_3$/SiN, $Al_2O_3$/$SiO_2$, $Al_2O_3$/$Si_3N_4$, AlN/SiN, AlN/$SiO_2$, and AlN/$Si_3N_4$.

The passivation layer 341 may surround the doped group III-V layer 36. The passivation layer 341 may cover the doped group III-V layer 36. The passivation layer 341 may surround the metal layer 371. The passivation layer 341 may cover the metal layer 371. The passivation layer 341 may cover a part of the metal layer 371. The passivation layer 341 may surround the gate conductor 372. The passivation layer 341 may surround a part of the gate conductor 372.

The passivation layer 342 may be disposed on the doped group III-V layer 36. The passivation layer 342 may be disposed on the group III-V layer 382. The passivation layer 342 may be disposed on the passivation layer 341. The passivation layer 342 may surround the gate conductor 372. The passivation layer 342 may surround the gate conductor 372. In some embodiments, the passivation layer 342 may include, but without limitation, oxides or nitrides, such as silicon nitride ($Si_3N_4$), silicon oxide ($SiO_2$), and the like. The passivation layer 342 may include, but without limitation, a composite layer of oxide and nitride, such as $Al_2O_3$/SiN, $Al_2O_3$/$SiO_2$, $Al_2O_3$/$Si_3N_4$, AlN/SiN, AlN/$SiO_2$, and AlN/$Si_3N_4$.

The dielectric constant of the passivation layer 341 may be different from the dielectric constant of the passivation layer 342. The dielectric constant of the passivation layer 341 may be less than the dielectric constant of the passivation layer 342. The passivation layer 341 may be of a material that has a relatively low dielectric constant, and the passivation layer 342 may be of a material having a relatively high dielectric constant. In some embodiments, the passivation layer 341 may include $SiO_2$ and the passivation layer 342 may include $Si_3N_4$. Both the passivation layer 341 and the passivation layer 342 may be located between the doped group III-V layer 36 and the field plate 321. Both the passivation layer 341 and the passivation layer 342 may be located between the doped group III-V layer 36 and the field plate 322. Both the passivation layer 341 and the passivation layer 342 may be located between the doped group III-V layer 36 and the field plate 323. Both the passivation layer 341 and the passivation layer 342 may be located under the field plate 323.

The passivation layer 341 that abuts the group III-V layer 382 may be of a low-k dielectric material, so as to reduce defects of the passivation layer 341 and the group III-V layer 382 and thus prevent current collapse. The passivation layer 342 that abuts the field plate 323 may use a high-k dielectric material to enhance the capabilities of the field plate 323 in masking 2DEG. The passivation layer 341 that abuts the doped group III-V layer 36 may be of a low-k dielectric material, so as to reduce defects of the passivation layer 341 and the doped group III-V layer 36 and thus prevent current collapse. The passivation layer 342 that abuts the field plate 323 may use a high-k dielectric material to enhance the capabilities of the field plate 323 in masking 2DEG. The semiconductor device 3 may also include other conductor structures. For example, the semiconductor device 3 may further include a source conductor 351, a drain conductor 311 or another conductor structure disposed on the substrate 39. Although the source conductor 351 and the drain conductor 311 are respectively disposed on two sides of the gate conductor 372 in FIG. 3, the source conductor 351, the drain conductor 311, and the gate conductor 372 may be configured differently in other embodiments of the present disclosure depending on design requirements.

The drain conductor 311 may be disposed on the group III-V layer 382. The drain conductor 311 may be surrounded by the passivation layer 341. The drain conductor 311 may be surrounded by the passivation layer 342. The drain conductor 311 may be covered by the dielectric layer 37. The drain conductor 311 may include, but without limitation, a conductor material. The conductor material may include, but without limitation, a metal, an alloy, a doped semiconductor material (such as a doped crystalline silicon) or another appropriate conductor material.

The interconnect structure 312 may be disposed on the drain conductor 311. The interconnect structure 312 may be electrically connected to the drain conductor 311. The interconnect structure 312 may include, but without limitation, a conductor material. The conductor material may include, but without limitation, a metal or another appropriate conductor material.

The source conductor 351 may be disposed on the group III-V layer 382. The source conductor 351 may be surrounded by the passivation layer 341. The source conductor 351 may be surrounded by the passivation layer 342. The source conductor 351 may be covered by the dielectric layer 37. The source conductor 351 may include, but without limitation, a conductor material. The conductor material may include, but without limitation, a metal, an alloy, a doped semiconductor material (such as a doped crystalline silicon) or another appropriate conductor material.

The interconnect structure 352 may be disposed on the source conductor 351. The interconnect structure 352 may be electrically connected to the source conductor 351. The interconnect structure 352 may include, but without limitation, a conductor material. The conductor material may include, but without limitation, a metal or another appropriate conductor material.

The semiconductor device 3 may further include a field plate 321, a field plate 322, and a field plate 323.

The field plate 321, the field plate 322, and the field plate 323 may be disposed without contacting each other. The field plate 321, the field plate 322, and the field plate 323 may be spaced out. The field plate 321 may be at a zero potential. The field plate 322 may be at a zero potential. The field plate 323 may be at a zero potential.

In some embodiments, the field plate 321 may be located in the passivation layer 342 between the gate and the drain.

In some embodiments, the field plate 322 may be located in the passivation layer 342. In some embodiments, the field plate 322 may be located in the passivation layer 342 between the gate and the drain and located on the field plate 321 such that the field plate 322 at least partially extends over the field plate 321. In some embodiments, the field plate 322 may be located in the passivation layer 342 and located under the field plate 323.

In some embodiments, the field plate 323 may be located on the passivation layer 342. In some embodiments, the field plate 323 may be located on the passivation layer 342 between the gate and the drain and located on the field plate 322. As seen in FIG. 3, field plate 323 completely extends over the field plate 321 and the field plate 322.

The field plate 321 may be connected to the source conductor 351. The field plate 321 may be connected to the source conductor 351 through another conductor structure (not shown in FIG. 3). The field plate 321 may be disposed without directly contacting the source conductor 351.

The field plate 322 may be connected to the source conductor 351. The field plate 322 may be connected to the source conductor 351 through another conductor structure (not shown in FIG. 3). The field plate 322 may be disposed without directly contacting the source conductor 351.

The field plate 323 may be connected to the source conductor 351. The field plate 323 may be connected to the source conductor 351 through another conductor structure (not shown in FIG. 3). The field plate 323 may be disposed without directly contacting the source conductor 351.

In some embodiments, the field plate 321, the field plate 322, and the field plate 323 may be electrically connected to the source conductor 351. The field plate 321 may be adjacent to the gate conductor 372. The field plate 322 may be adjacent to the gate conductor 372. The field plate 321 may partially overlap the field plate 322. The field plate 323 may partially overlap the field plate 321. The field plate 323 may partially overlap the field plate 322.

The field plate 321 can reduce an electric field of a gate contact structure. The field plate 322 can reduce an electric field of a gate contact structure. The field plate 323 can reduce an electric field of a gate contact structure.

The field plate 321 can evenly distribute an electric field among conductor structures (such as the gate conductor 372, the source conductor 351, and the drain conductor 311), improve voltage endurance, allow voltage to be smoothly released, and improve reliability of the device. The field plate 322 can evenly distribute an electric field among conductor structures (such as the gate conductor 372, the source conductor 351, and the drain conductor 311), improve voltage endurance, allow voltage to be smoothly released, and improve reliability of the device. The field plate 323 can evenly distribute an electric field among conductor structures (such as the gate conductor 372, the source conductor 351, and the drain conductor 311), improve voltage endurance, allow voltage to be smoothly released, and improve reliability of the device.

Although FIG. 3 illustrates that the semiconductor device 3 has 3 field plates, the present disclosure is not limited to the illustration. In some embodiments, the semiconductor device 3 may include less than 3 field plates. In some embodiments, the semiconductor device 3 may include more than 3 field plates.

The dielectric layer 37 may be disposed on the passivation layer 342. The dielectric layer 37 may cover the passivation layer 342. The dielectric layer 37 may be disposed on the drain conductor 311. The dielectric layer 37 may be disposed on the source conductor 351. The dielectric layer 37 may be disposed on the field plate 321. The dielectric layer 37 may be disposed on the field plate 322. The dielectric layer 37 may be disposed on the field plate 323. The dielectric layer 37 may surround the field plate 323. The dielectric layer 37 may serve as an interlayer dielectric layer. The dielectric layer 37 may include a dielectric material. The dielectric layer 37 may include a nitride. The dielectric layer 37 may include, but without limitation, silicon nitride ($Si_3N_4$). The dielectric layer 37 may include an oxide. The dielectric layer 37 may include, but without limitation, silicon oxide ($SiO_2$). The dielectric layer 37 may be configured to prevent foreign substances such as moisture from entering the device. The dielectric layer 37 may be configured to withstand a mechanical stress of package singulation, thereby protecting the entire device.

In some embodiments, because the group III-V layer 382a has generated an actual channel (electronic channel region) under the gate conductor 372, the device is turned on by default in a case that the gate conductor 372 is in a zero-bias state. Such a device is also known as a depletion mode device.

The opposite of the depletion mode device is an enhancement mode device. The enhancement mode device is turned off by default in a case that the gate conductor 372 is in a zero-bias state.

Figure 4:
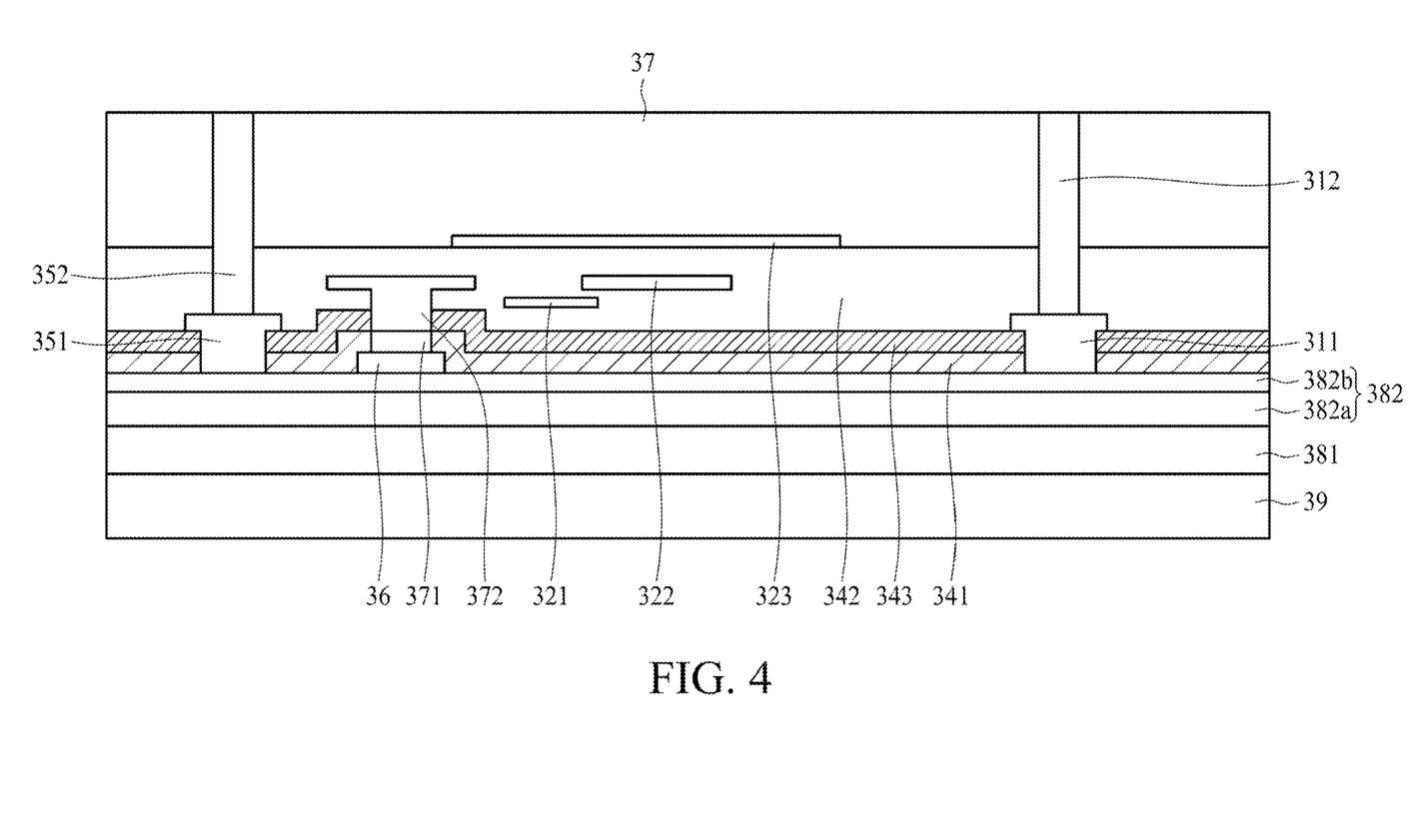
FIG. 4 is a side view of a semiconductor device according to some embodiments of the present disclosure.

FIG. 4 is a side view of a semiconductor device 4 according to some embodiments of the present disclosure.

As shown in FIG. 4, the semiconductor device 4 may include a substrate 39, a superlattice layer 381, a group III-V layer 382, a metal layer 371, a gate conductor 372, a doped group III-V layer 36, a source conductor 351, an interconnect structure 352, a passivation layer 341, a passivation layer 342, a passivation layer 343, a field plate 321, a field plate 322, a field plate 323, a drain conductor 311, and an interconnect structure 312.

Characteristics of the semiconductor device 4 are substantially the same as those of the semiconductor device 3 in FIG. 3. The semiconductor device 4 differs from the semiconductor device 3 in FIG. 3 in that the semiconductor device 4 further includes a passivation layer 343.

The passivation layer 343 may be disposed on the passivation layer 341. The passivation layer 343 may surround the gate conductor 372. The passivation layer 343 may surround the doped group III-V layer 36. The passivation layer 343 may cover the doped group III-V layer 36. The passivation layer 343 may surround the passivation layer 341. The passivation layer 343 may cover the passivation layer 341. The passivation layer 343 may be disposed on the group III-V layer 382. The passivation layer 343 may be located between the field plate 323 and the doped group III-V layer 36. The passivation layer 343 may be located between the field plate 323 and the passivation layer 341. The passivation layer 343 may be disposed under the passivation layer 342. The passivation layer 343 may be surrounded by the passivation layer 342. The passivation layer 343 may be covered by the passivation layer 342. The passivation layer 343 may be disposed between the passivation layer 341 and the passivation layer 342. The passivation layer 343 may be disposed on the doped group III-V layer 36 and between the passivation layer 341 and the passivation layer 342. The passivation layer 343 may be disposed under the field plate 323 and between the passivation layer 341 and the passivation layer 342. In some embodiments, the passivation layer 343 may include, but without limitation, oxides or nitrides, such as silicon nitride ($Si_3N_4$), silicon oxide ($SiO_2$), and the like. The passivation layer 343 may include, but without limitation, a composite layer of oxide and nitride, such as $Al_2O_3/SiN$, $Al_2O_3/SiO_2$, $Al_2O_3/Si_3N_4$, $AlN/SiN$, $AlN/SiO_2$, and $AlN/Si_3N_4$.

The dielectric constant of the passivation layer 343 may be different from the dielectric constant of the passivation layer 341. The dielectric constant of the passivation layer 343 may be different from the dielectric constant of the passivation layer 342. The dielectric constant of the passivation layer 343 may be greater than the dielectric constant of the passivation layer 341. The dielectric constant of the passivation layer 343 may be greater than the dielectric constant of the passivation layer 342. The dielectric constant of the passivation layer 343 may be less than the dielectric constant of the passivation layer 342. The dielectric constant of the passivation layer 343 may be less than the dielectric constant of the passivation layer 342 and greater than the dielectric constant of the passivation layer 341. In a case that the passivation layer 341 is of a material that has a relatively low dielectric constant and the passivation layer 342 is of a material having a relatively high dielectric constant, the dielectric constant of the passivation layer 343 may be greater than the dielectric constant of the passivation layer 342. In some embodiments, the passivation layer 341 may include $SiO_2$, the passivation layer 342 may include $Al_2O_3$, and the passivation layer 343 may include $Si_3N_4$. All the passivation layer 341, the passivation layer 342, and the passivation layer 343 may be located between the doped group III-V layer 36 and the field plate 323.

Although FIG. 4 illustrates that the semiconductor device 4 may have 3 passivation layers, the present disclosure is not limited to the illustration. In some embodiments, the semiconductor device 4 may include more than 3 passivation layers. In some embodiments, the semiconductor device 4 may include more than 3 passivation layers between the doped group III-V layer 36 and the field plate 323. For example, there may be 4 passivation layers between the doped group III-V layer 36 and the field plate 323. The 4 passivation layers may have different dielectric constants. The dielectric constant of the passivation layer that abuts the doped group III-V layer 36 may be less than the dielectric constant of the passivation layer that abuts the field plate 323. For example, there may be n passivation layers between the doped group III-V layer 36 and the field plate 323. The n passivation layers may have different dielectric constants. The dielectric constant of the passivation layer that abuts the doped group III-V layer 36 may be less than the dielectric constant of the passivation layer that abuts the field plate 323. For example, there may be n passivation layers between the doped group III-V layer 36 and the field plate 323. The n passivation layers may have different dielectric constants. In a direction from the doped group III-V layer 36 to the field plate 323, the dielectric constants of the n passivation layers may increase layer by layer. For example, there may be n passivation layers between the doped group III-V layer 36 and the field plate 323. The n passivation layers may have different dielectric constants. The passivation layer that abuts neither the doped group III-V layer 36 nor the field plate 323 may have a smallest dielectric constant. For example, there may be n passivation layers between the doped group III-V layer 36 and the field plate 323. The n passivation layers may have different dielectric constants. The passivation layer that abuts neither the doped group III-V layer 36 nor the field plate 323 may have a largest dielectric constant.

FIG. 5a, FIG. 5b, FIG. 5c, and FIG. 5d show several operations of manufacturing a semiconductor device 1 according to some embodiments of the present disclosure. Although FIG. 5a, FIG. 5b, FIG. 5c, and FIG. 5d illustrate several operations of manufacturing the semiconductor device 1, similar operations may also be performed to manufacture the semiconductor device 2, 3, or 4.

Figure 5A:
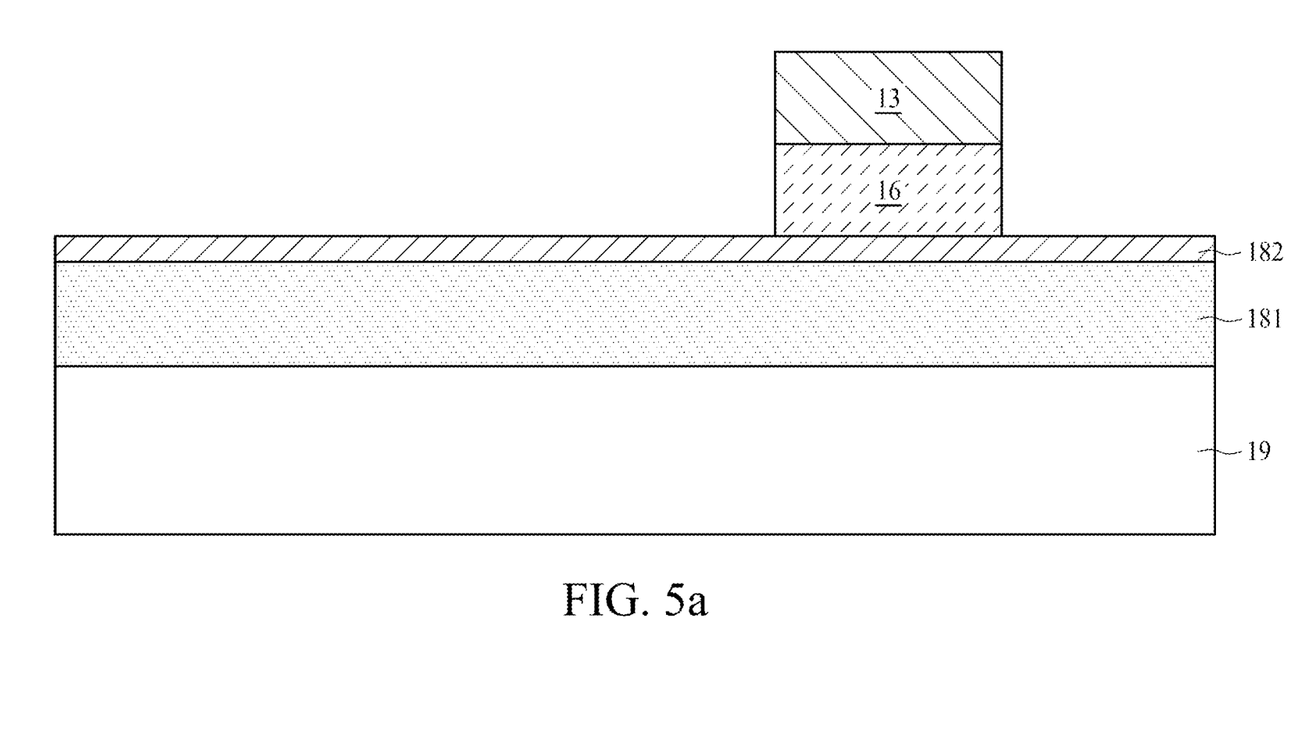
FIG. 5a, FIG. 5b, FIG. 5c, and FIG. 5d show operations of manufacturing a semiconductor device according to some embodiments of the present disclosure.

Referring to FIG. 5a, a substrate 19 is provided. In some embodiments, the substrate 19 may include a silicon substrate. In some embodiments, the substrate 19 may be doped with a dopant. In some embodiments, the substrate 19 may include a p-type semiconductor substrate. In some embodiments, the substrate 19 may be doped with at least one of boron (B) or gallium (Ga) to form a p-type semiconductor substrate. In some embodiments, the substrate 19 may include an n-type semiconductor substrate. In some embodiments, the substrate 19 may be doped with at least one of phosphorus (P) or arsenic (As) to form an n-type semiconductor substrate.

In some embodiments, a group III-V layer 181 and a group III-V layer 182 are disposed on the substrate 19. In some embodiments, the group III-V layer 181 and the group III-V layer 182 may be epitaxially grown on the substrate 19. In some embodiments, the group III-V layer 181 and the group III-V layer 182 may be formed on the substrate 19 by performing a chemical vapor deposition (CVD) step and/or another appropriate deposition step.

In some embodiments, a doped group III-V layer 16 and a gate conductor 13 are formed on the substrate 19.

In some embodiments, a doped group III-V layer 16 is formed on the group III-V layer 182. In some embodiments, the doped group III-V layer 16 may be formed through metal organic chemical vapor deposition (MOCVD), and doped with a dopant.

In some embodiments, a gate conductor 13 is formed on the doped group III-V layer 16. In some embodiments, the gate conductor 13 may be deposited on the doped group III-V layer 16. In some embodiments, the gate conductor 13 may be formed through physical vapor deposition (PVD), chemical vapor deposition, atomic layer deposition (ALD), plating, and/or another appropriate deposition step. The gate conductor 13 is formed in a gate first process. The gate conductor 13 is formed before the source conductor 15 and the drain conductor 11 are formed. The gate conductor 13 may serve as a stop layer or a protection layer of the doped group III-V layer 16.

In some embodiments, a patterned hard mask may be formed above the gate conductor 13. Subsequently, a part not masked by the patterned hard mask may be removed through photolithography or by other means to form the gate conductor 13. In some embodiments, the patterned hard mask may include, but without limitation, silicon nitride (SiN), silicon oxynitride (SiON), and silicon carbide (SiC). In some embodiments, the etching step may be performed using dry etching, wet etching, or a combination of dry etching and wet etching.

In some embodiments, the part not masked by the patterned hard mask is further removed by using the patterned hark mask, so as to form the doped group III-V layer 16. In some embodiments, a width of the doped group III-V layer 16 may be substantially equal to a width of the gate conductor 13. In some embodiments, the width of the doped group III-V layer 16 may be greater than the width of the gate conductor 13.

In some embodiments, an etchant for etching the gate conductor 13 may be ammonia water ($NH_4OH$), hydrogen peroxide ($H_2O_2$), sulfuric acid ($H_2SO_4$), hydrofluoric acid (HF), or ammonium fluoride ($NH_4F$), or a mixture thereof. The doped group III-V layer 16 may be subjected to anisotropic etching in a way of dry etching.

Figure 5B:
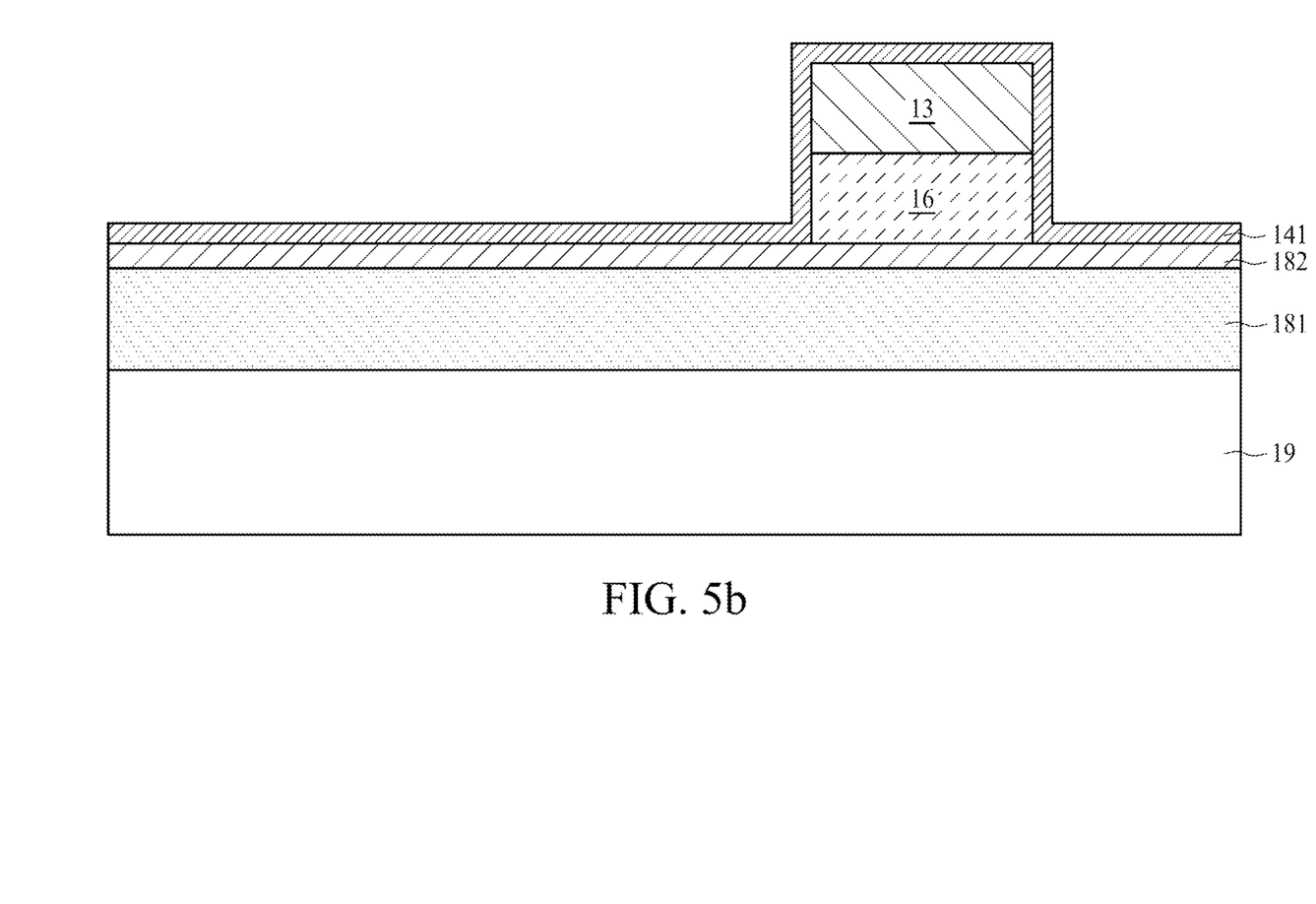

Referring to FIG. 5b, after the patterned hard mask is removed, a passivation layer 141 is formed. In some embodiments, the passivation layer 141 is formed on the gate conductor 13. In some embodiments, the passivation layer 141 is formed on the doped group III-V layer 16. In some embodiments, the passivation layer 141 is formed on the group III-V layer 182. The passivation layer 141 may be deposited on the gate conductor 13. The passivation layer 141 may be deposited on the doped group III-V layer 16. The passivation layer 141 may be deposited on the group III-V layer 182. In some embodiments, the passivation layer 141 may be formed through CVD or another appropriate deposition step.

Figure 5C:
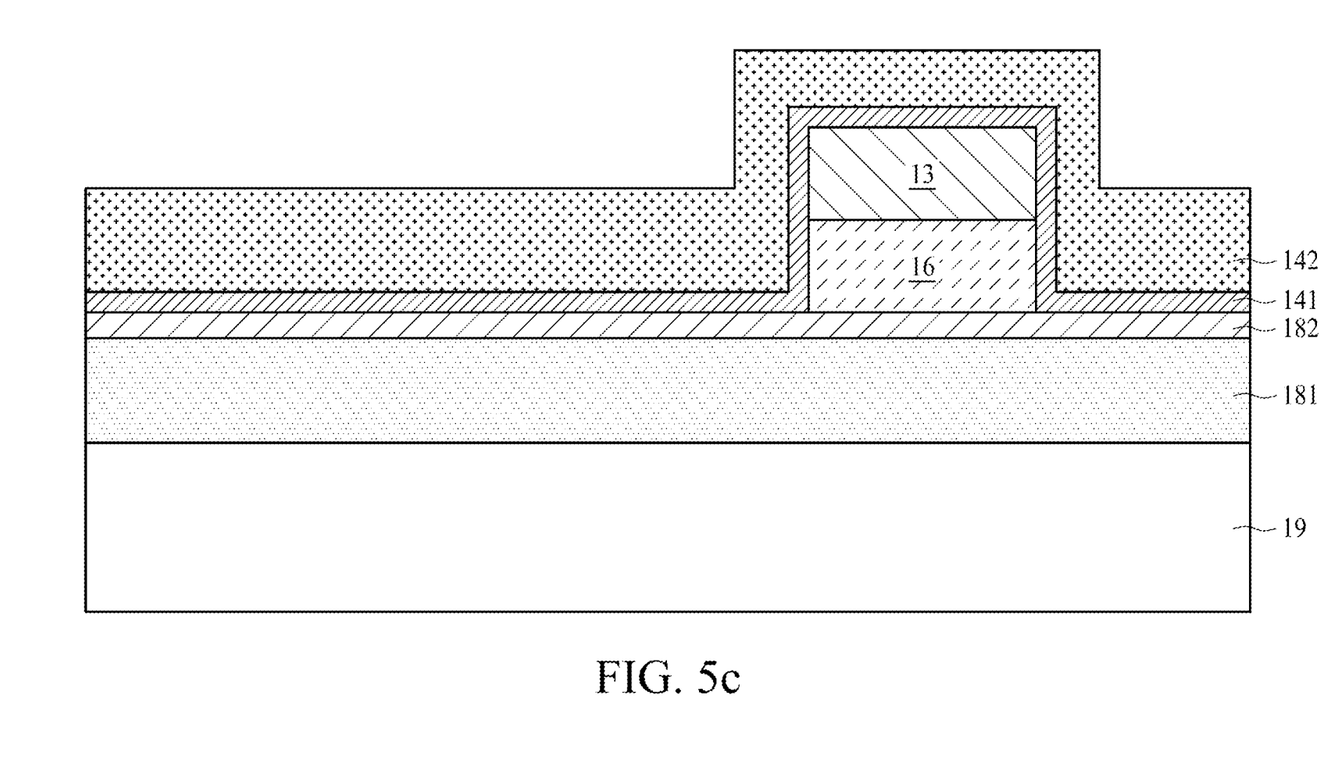

Referring to FIG. 5c, the passivation layer 141 is formed. In some embodiments, the passivation layer 142 is formed on the passivation layer 141.

The passivation layer 142 may be deposited on the passivation layer 141. In some embodiments, the passivation layer 141 may be formed through CVD or another appropriate deposition step.

Referring to FIG. 5b and FIG. 5c, the dielectric constant of the passivation layer 141 may be different from the dielectric constant of the passivation layer 142. The dielectric constant of the passivation layer 141 may be less than the dielectric constant of the passivation layer 142. The passivation layer 141 may be of a material that has a relatively low dielectric constant, and the passivation layer 142 may be of a material having a relatively high dielectric constant. In some embodiments, the passivation layer 141 may include $SiO_2$ and the passivation layer 142 may include $Si_3N_4$.

Figure 5D:
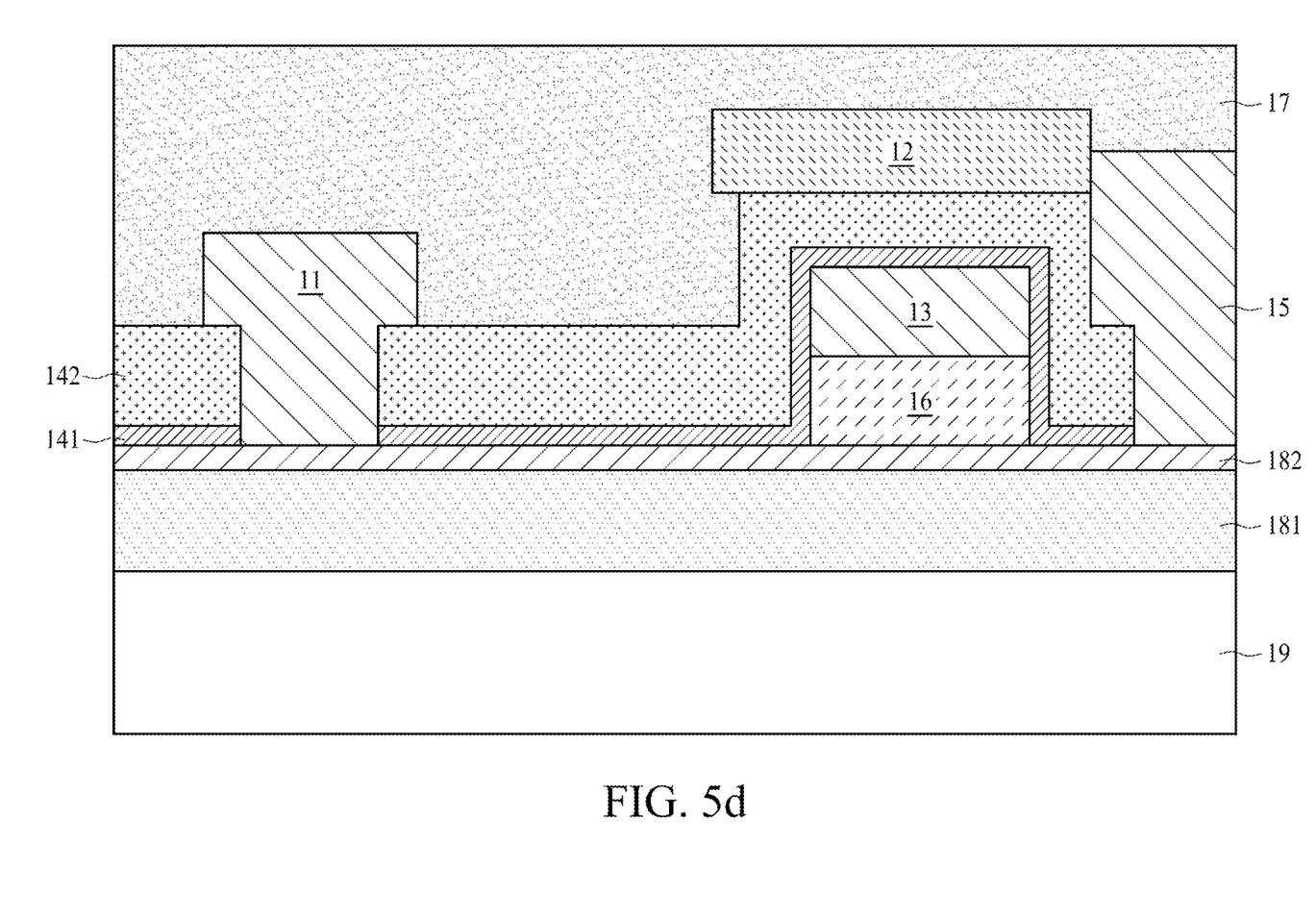

Referring to FIG. 5d, a source conductor 15 and a drain conductor 11 are formed. In some embodiments, after source conductor holes and drain conductor holes are formed, the holes are filled with a material form the source conductor 15 and the drain conductor 11. In some embodiments, this involves multiple steps, including photolithography, etching, and deposition. Photolithography and etching include: forming a patterned mask on the passivation layer 142, and etching the passivation layer 141 and the passivation layer 142 to form source conductor holes and drain conductor holes. A part of the group III-V layer 182 is exposed from the bottoms of source contact holes and drain contact holes. Subsequently, the holes are filled with materials through a deposition step such as CVD, PVD, and electroplating, so as to form the source conductor 15 and the drain conductor 11. The source conductor 15 may include a metal compound. The source conductor 15 may include, but without limitation, titanium nitride (TiN), tantalum nitride (TaN), and tungsten carbide (WC). The drain conductor 11 may include a metal compound. The drain conductor 11 may include, but without limitation, titanium nitride (TiN), tantalum nitride (TaN), and tungsten carbide (WC).

Still referring to FIG. 5d, a field plate 12 is formed. In some embodiments, the field plate 12 is formed on the passivation layer 142. In some embodiments, the field plate 12 may be formed by depositing a conductor material and then defining a pattern. For example, a metal may be deposited by sputtering, and a pattern may be defined by means of dry etching. The field plate 12 may be deposited on the passivation layer 142. The field plate 12 may be deposited on the passivation layer 142, so that both the passivation layer 141 and the passivation layer 142 are located between the gate conductor 13 and the field plate 12.

Still referring to FIG. 5d, a dielectric layer 17 is formed. In some embodiments, the dielectric layer 17 is deposited on the passivation layer 142 and the field plate 12. In some embodiments, the dielectric layer 17 may be deposited by CVD, spin-on, sputtering, or by other means. Subsequently, a surface of the dielectric layer 17 is processed through chemical-mechanical planarization (CMP). The dielectric layer 17 may be formed to separate the field plate 12 from the source conductor 11.

In some embodiments, the field plate 12 may be formed together with the source conductor 15 and/or the drain conductor 11. In some embodiments, the field plate 12 may be of the same material as the source conductor 15 and/or the drain conductor 11.

As used herein, for ease of description, space-related terms such as "under", "below", "lower portion", "above", "upper portion", "lower portion", "left side", "right side", and the like may be used herein to describe a relationship between one element or feature and another element or feature as shown in the figures. In addition to orientation shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

What is claimed is:

1. A semiconductor device, comprising:
   a substrate;
   a channel layer comprising a first III-V material positioned on or over the substrate;
   a barrier layer comprising second III-V material positioned on or over the channel layer, the barrier layer having a bandgap larger than that of the channel layer;
   a doped group III-V layer disposed on the second III-V barrier layer;
   a gate conductor disposed on the doped group III-V layer;
   a source electrode contacting the barrier layer on a first side of the gate conductor;
   a drain electrode contacting the barrier layer on a second side of the gate conductor;
   a first passivation layer positioned on the barrier layer, and having a first dielectric constant;
   a second passivation layer positioned on the first passivation layer, and having a second dielectric constant, the second dielectric constant being greater than the first dielectric constant;
   a third passivation layer positioned on the second passivation layer and over the first passivation layer, and having a third dielectric constant greater than the first dielectric constant;
   a first field plate embedded in the third passivation layer and laterally extending only from a first start point that is positioned between the gate conductor and the drain electrode to a second end point that is positioned between the gate conductor and the drain electrode;
   a second field plate embedded in the third passivation layer laterally extending only from a first start point that is positioned between the gate conductor and the drain electrode to a second end point that is positioned between the gate conductor and the drain electrode, wherein the second field plate at least partially extends directly over the first field plate;
   a third field plate positioned on a top surface of the third passivation layer laterally extending only from a first start point that is positioned between a position directly above the gate conductor or between the gate conductor and the drain electrode to a second end point that is positioned between the gate conductor and the drain electrode, wherein the third field plate completely extends directly over the first field plate and the second field plate.

2. The semiconductor device according to claim 1, wherein at least one of the first, second, or third field plates is electrically connected to the source electrode.

3. The semiconductor device according to claim 1, wherein the first passivation layer includes $SiO_2$.

4. The semiconductor device according to claim 1, wherein the second passivation layer includes $Si_3N_4$.

5. The semiconductor device according to claim 1, wherein the third dielectric constant is less than the second dielectric constant and greater than the first dielectric constant.

6. The semiconductor device according to claim 1, wherein
   the first group III-V material comprises GaN.

7. The semiconductor device according to claim 1, wherein
   the second group III-V material comprises AlGaN.

8. The semiconductor device according to claim 1, further comprising a fourth passivation layer positioned on the third passivation layer.

* * * * *